US006621294B2

(12) United States Patent
Hsu et al.

(10) Patent No.: US 6,621,294 B2
(45) Date of Patent: Sep. 16, 2003

(54) PAD SYSTEM FOR AN INTEGRATED CIRCUIT OR DEVICE

(75) Inventors: Louis L. Hsu, Fishkill, NY (US); Li-Kong Wang, Montvale, NJ (US); Chorng-Lii Hwang, Wappinger Falls, NY (US)

(73) Assignee: IBM Corporation, Armonk, NY (US)

( * ) Notice: Subject to any disclaimer, the term of this patent is extended or adjusted under 35 U.S.C. 154(b) by 0 days.

(21) Appl. No.: 10/037,660

(22) Filed: Jan. 3, 2002

(65) Prior Publication Data

US 2003/0122576 A1 Jul. 3, 2003

(51) Int. Cl.[7] .............................................. H03K 19/20
(52) U.S. Cl. ........................ 326/37; 326/47; 326/101; 326/104; 438/14; 438/17
(58) Field of Search ........................... 326/37, 47, 101, 326/104; 438/14, 17

(56) References Cited

U.S. PATENT DOCUMENTS

| 5,585,675 A | 12/1996 | Knopf |
| 5,796,266 A | 8/1998 | Wright et al. |
| 6,121,785 A | 9/2000 | Wright et al. |
| 6,133,053 A | 10/2000 | Wright et al. |
| 6,204,072 B1 | 3/2001 | Wright et al. |
| 6,229,343 B1 * | 5/2001 | Bauer et al. ................. 326/104 |
| 6,411,127 B2 * | 6/2002 | Lee .............................. 326/83 |

* cited by examiner

Primary Examiner—Michael Tokar
Assistant Examiner—Vibol Tan
(74) Attorney, Agent, or Firm—Dilworth & Barrese, LLP

(57) ABSTRACT

The present invention provides a pad system for an integrated circuit or device. The pad system includes logic circuitry having at least one pad input terminal for connecting to at least one pad and at least two output terminals for connecting to the at least one circuit system of the integrated circuit or device. The logic circuitry is configurable to selectively connect the at least one pad between at least two points of the at least one circuit system of the integrated circuit or device.

13 Claims, 6 Drawing Sheets

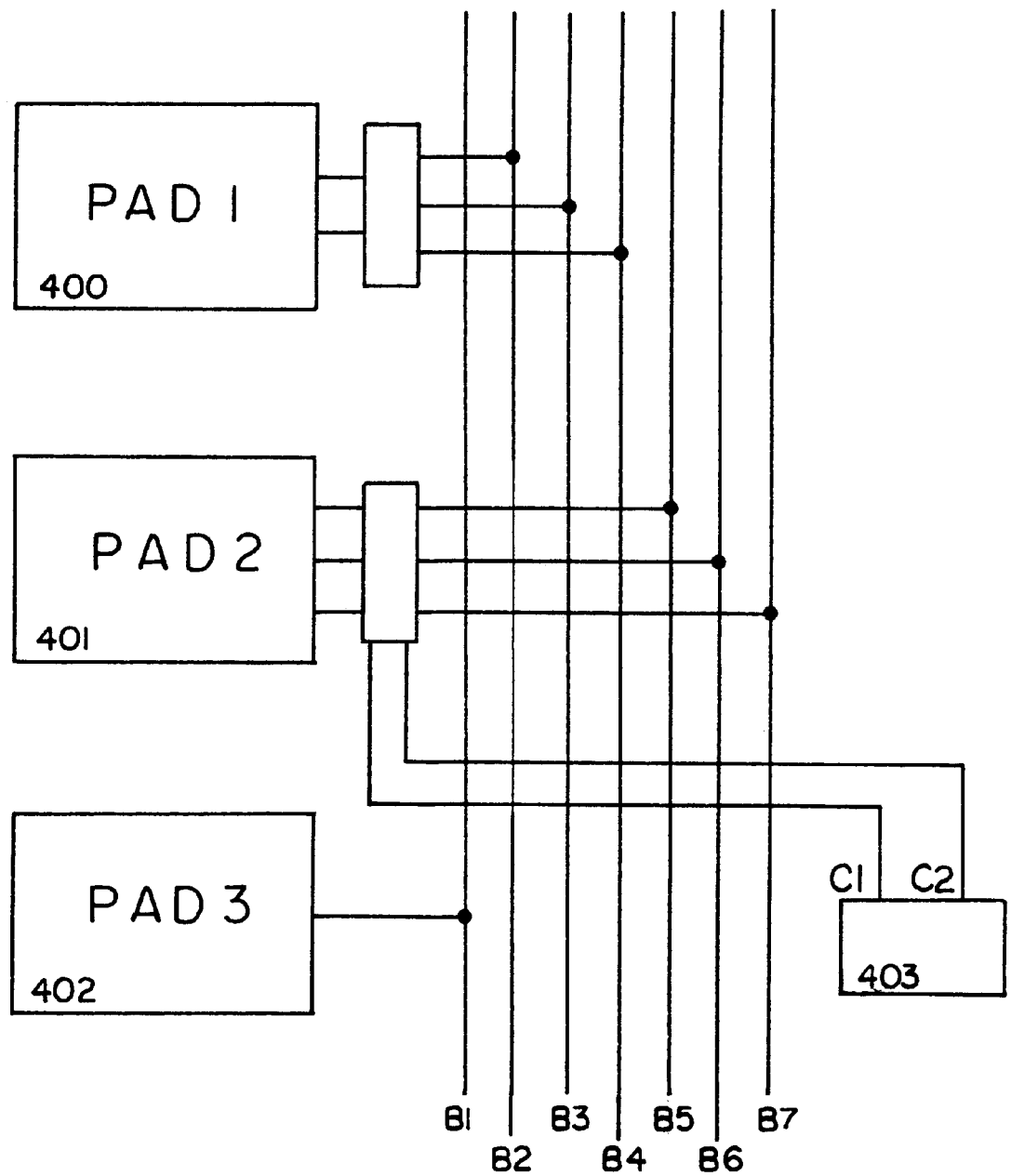
F I G . 4

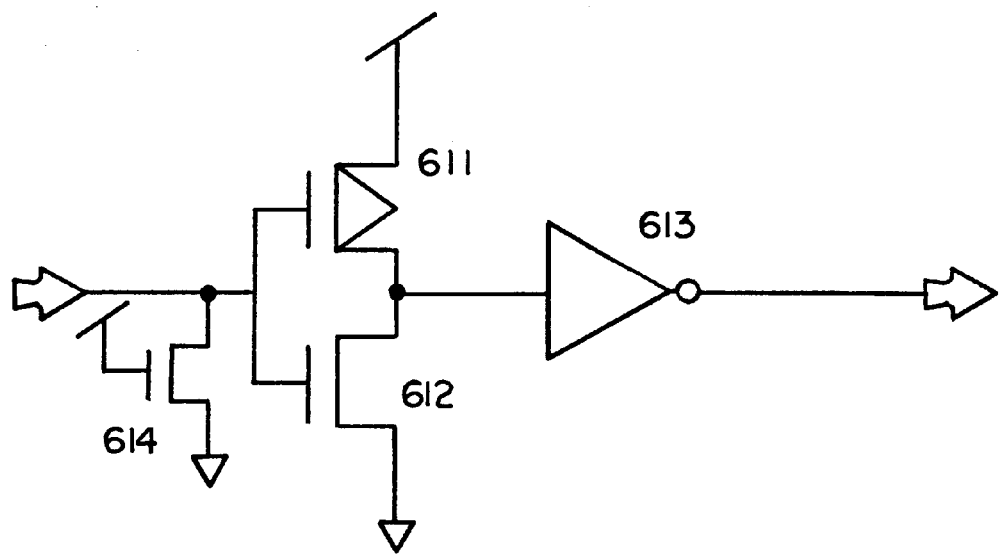
F I G. 6A
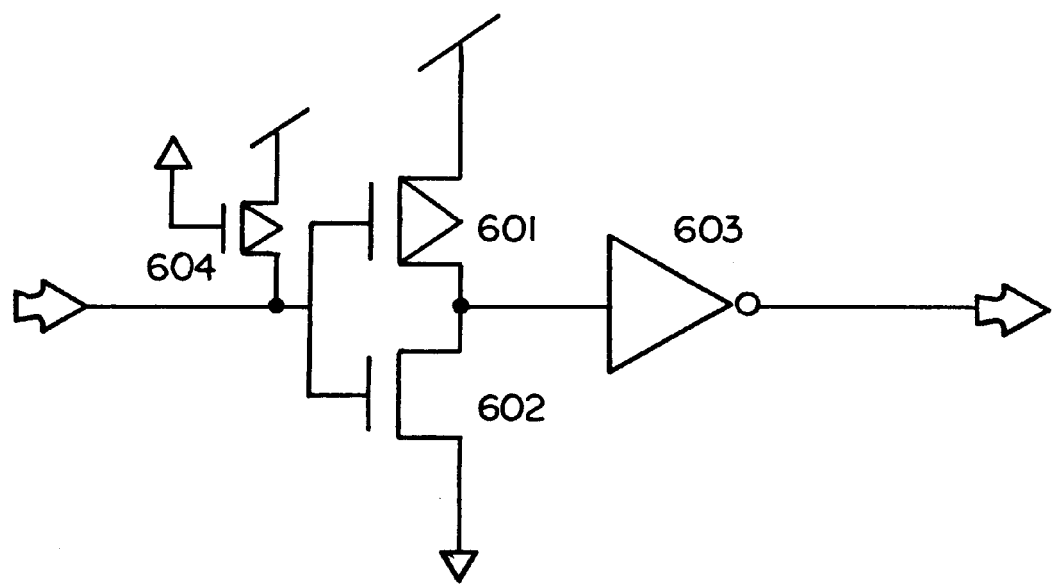
F I G. 6B

US 6,621,294 B2

PAD SYSTEM FOR AN INTEGRATED CIRCUIT OR DEVICE

FIELD OF THE INVENTION

The present invention relates generally to integrated circuits, and more specifically, to a pad system for an integrated circuit or device.

Particularly disclosed herein is a pad system where the number of pads of a semiconductor chip can be greatly reduced as compared to prior art pad systems. One pad can be used for multiple testing purposes, and/or be shared by different applications, including customizing, testing, debugging, monitoring, data retrieving, voltage/power supplying, etc.

BACKGROUND OF THE INVENTION

During the manufacture of an integrated circuit (IC) or device, access points are provided which remain accessible after completion of the manufacturing process. These access points or pads form a pad system which is situated on the integrated circuit or device. Each pad of the pad system is electrically connected to points within the integrated circuit or device, especially to points that would otherwise be inaccessible. The pads traditionally function as signal ports, power input or output ports, and/or test points that allow individual sections of the integrated circuit or device to be accessed and tested, monitored and/or configured for differing applications.

As integrated circuit and devices have become more and more complex with the improvement of technology, a greater number of pads are required to fully access the integrated circuit or device and accurately test, monitor and configure the integrated circuit or device. Even at this stage in the development of integrated circuits and devices, the number of pads required to comprehensively test, monitor and configure the integrated circuit or device has surpassed the available space for the pads themselves. Accordingly, a pad system is required which uses less area of an integrated circuit or device than prior art pad systems.

SUMMARY

It is, therefore, an aspect of the present invention to provide a pad system for an integrated circuit or device where one pad is used to test various sections of the integrated circuit or device.

It is another aspect of the present invention to provide a pad system for an integrated circuit or device for changing bonding connections within the integrated circuit or device.

It is a further aspect of the present invention to provide a pad system for an integrated circuit or device for changing pad connections to supply and/or monitor voltages within the integrated circuit or device.

It is still a further aspect of the present invention to provide a pad system for an integrated circuit or device for changing pad connections to test programming of the integrated circuit or device.

The above aspects can be achieved by the present invention which provides a pad system for an integrated circuit or device. The pad system includes logic circuitry having at least one pad input terminal for connecting to at least one pad and at least two output terminals for connecting to at least one circuit system of the integrated circuit or device. The logic circuitry is configurable to selectively connect the at least one pad between at least two points of the at least one circuit system of the integrated circuit or device.

BRIEF DESCRIPTION OF THE FIGURES

FIG. 4 is a diagram illustrating a system incorporating the first and second embodiments of the present invention;

FIGS. 6A and 6B illustrate a bleed low and a bleed high buffer, respectively.

DETAILED DESCRIPTION OF THE INVENTION

Preferred embodiments of the present invention will be described herein below with reference to the accompanying drawings. In the following description, well-known functions or constructions are not described in detail since they would obscure the invention in unnecessary detail.

In various integrated circuits, pads are permanently bonded to respective internal locations within the integrated circuit or device. Traditionally, after the pad bonding process during the manufacturing stage of the integrated circuit, the electrical connections within the integrated circuit or device cannot be reconfigured. This permanent bonding process requires each integrated circuit or device to be manufactured to a specific end use. For example, in order to provide different operating modes for a memory chip, such as single data rate (SDR) or double data rate (DDR), or different operating bandwidths, e.g., X64, X128, or X256, multiple pads are required to be connected to the proper internal sections of the integrated circuit or device. This increase in the number of required pads increases the overall size of the integrated circuit or device, a result not particularly desired in a field of technology where larger size, generally equates to additional cost.

Rather than bonding a single pad to a single point in the integrated circuit or device, the present invention provides for a single pad to be connectable or selectively switchable between multiple points in the integrated circuit device. The present invention provides for the actual electrical testing path to be chosen by a user, e.g., a diagnostics technician. Hence, the single pad can be used to test more than one internal circuit of the integrated circuit or device as compared to prior art pad systems.

Figure 1:
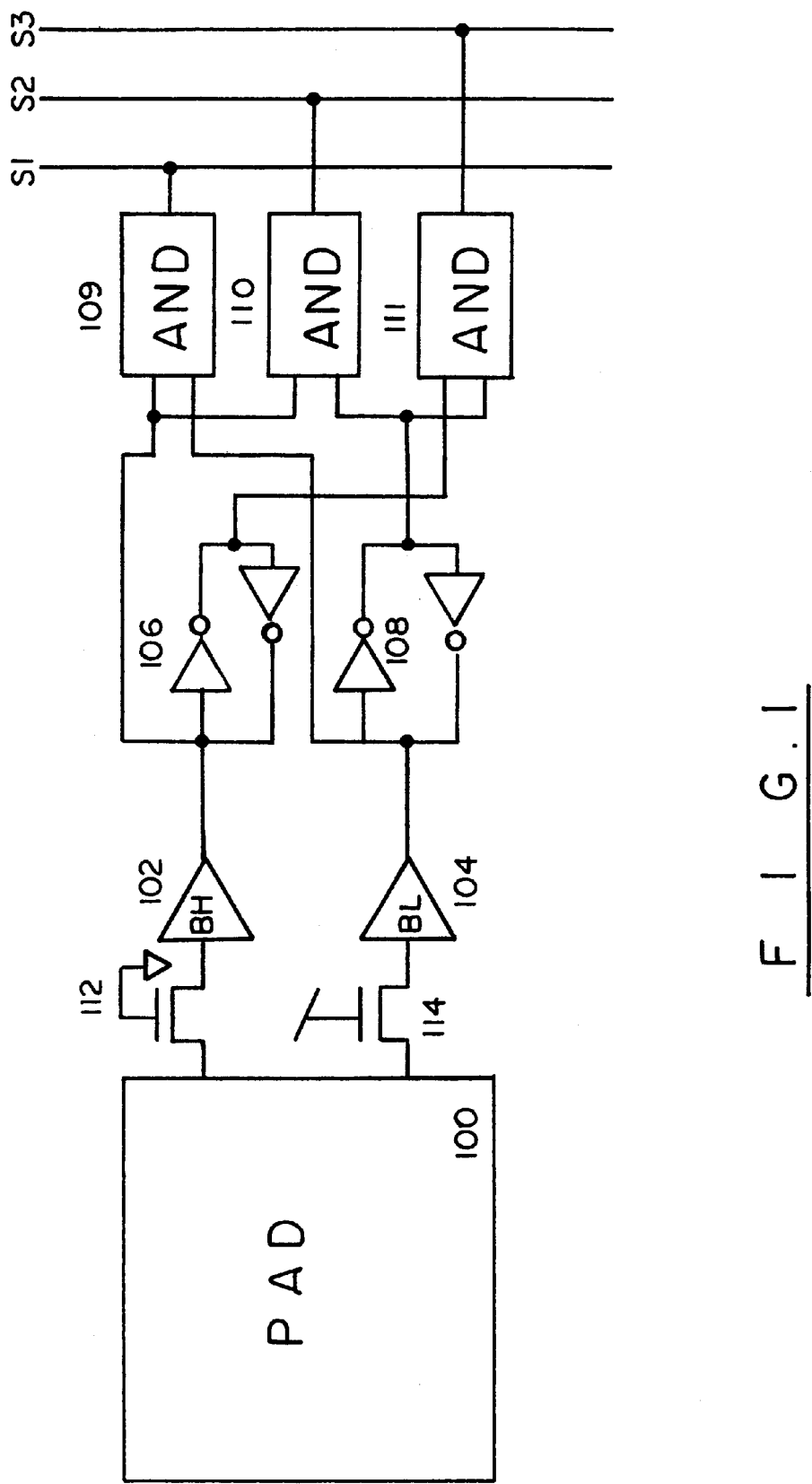
FIG. 1 is a diagram illustrating a first embodiment of the present invention.

FIG. 1 illustrates a first embodiment of a pad system according to the present invention which is designated by reference numeral 150. The pad system 150 includes pad 100, pull-up transistor 112 and pull-down transistor 114, bleed-high buffer 102 and bleed-low buffer 104 each connected to pad 100, latches 106 and 108 connected to bleed-high buffer 102 and bleed-low buffer 104, respectively, AND gates 109–111 connected to various inputs and outputs of latches 106 and 108, and signal buses S1–S3. In the traditional pad configuration, shown in prior art FIG. 2, three pads 201–203 are required to connect to the three signal buses S1–S3, one pad bonded to each bus. In both FIGS. 1 and 2 the signals placed on the signal buses control the operation of the integrated circuit or device.

Figure 2:
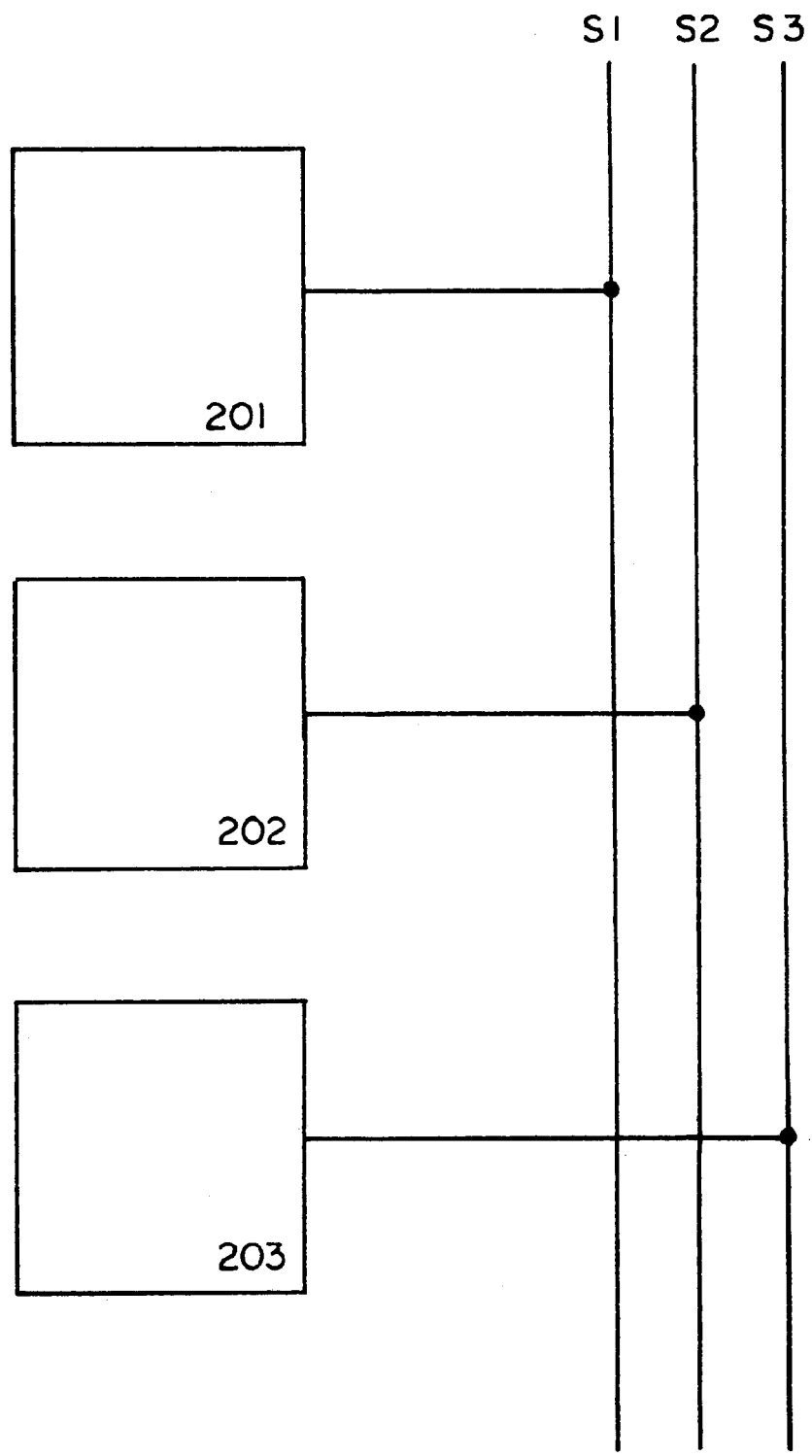
FIG. 2 is a diagram illustrating a conventional pad configuration.

In the example of the memory chip operating bandwidths presented above, it will be assumed that if a high signal is provided to signal bus S1 in FIG. 2, the X64 operating bandwidth is selected; if the high signal is provided to signal bus S2, the X128 operating bandwidth is selected; and if a high signal is provided to signal bus S3, the X256 operating bandwidth is selected. To select X64 in the traditional pad configuration system, a logic high signal provided to pad 201 provides a logic high signal to signal bus S1, thus enabling the X64 operating bandwidth mode. Pads 202 and 203 remain static and unused, an inefficient use of valuable chip real estate.

Referring back to FIG. 1, the single pad 100 in the present invention of the pad system 150 can be used to enable any one of the three operating bandwidth modes. Hence, only one pad is required as compared to the prior art pad system shown in FIG. 2. Table 1 is a truth table showing the inputs and outputs to and from pad 100. Listed in the first column are the three possible input signals that can be provided to pad 100, i.e., a high, a low or a floating signal. The input signals can be provided from a voltage supply or control circuit. The floating signal has no voltage level applied to pad 100. Listed in the second column of Table 1 are the three signal buses, S1–S3, and listed in the third column are the resulting logic signals on the signal buses S1–S3.

By utilizing the effects: of the bleed-high buffer 102 and bleed-low buffer 104, and transistors 112 and 114, the third or floating resulting logic can be achieved. When no voltage signal is placed on pad 100, bleed-high buffer 102 as outputs a high signal and bleed-low buffer 104 outputs a low signal. Transistors 112 and 114 are needed to stabilize the circuit in this state by avoiding a short circuit from occurring through pad 100 between the buffer inputs.

The bleed-high buffer 102 and bleed-low buffer 104 are constructed from nMOS devices. The bleed-high and bleed-low buffers 102 and 104 are illustrated in FIGS. 6A and 6B. The bleed-low buffer 102 will have a low output, if the input signal is a floating signal, since a weak pull-down nMOS device is constantly turned on. But when the input signal is high, it will overpower the bleed-low buffer 102 and force a high output. On the contrary, the bleed-high buffer 104 will have a constantly high output, unless the input is low. The buffers 102 and 104 produce a high and a low signal, respectively, when no input signal is applied to pad 100.

TABLE 1

| Pad Input Signal | Signal Bus | Resulting Logic Signal on Signal Bus |
|---|---|---|
| High | S1 | high |
|  | S2 | low |
|  | S3 | low |
| Floating | S1 | low |
|  | S2 | high |
|  | S3 | low |
| Low | S1 | low |
|  | S2 | low |
|  | S3 | high |

As can be observed from FIG. 1 and Table 1, a high logic signal applied to pad 100 results in a high logic signal on signal bus S1; a low logic signal applied to pad 100 results in a high logic signal on signal bus S3; and no signal applied to pad 100 (i.e., the floating signal described above) results in a high logic signal on signal bus S2. The result of the high logic signal on signal bus S2 is achieved by the bleed-high and bleed-low buffers 102 and 104.

With reference to FIG. 1, latches 106 and 108 each include two inverters to invert the signal output from the bleed-high and bleed-low buffers 102 and 104, and also function to stabilize the operation of the overall circuit. Thus, by implementing the present invention, the single pad 100 can be used in place of the three pads 201–203 in prior art pad systems.

During operation of the pad system 150 illustrated in FIG. 1, when a logic high signal is applied to pad 100, bleed-high buffer 102 and bleed-low buffer 104 each output a logic high signal. Latches 106 and 108 receive the logic high signal and stabilize the signal at a high level. AND gate 109 receives a logic; high signal at both of its inputs; AND gate 110 receives a logic high signal at one of its inputs and a logic low signal at the other input; and AND gate 111 receives a logic low signal at both of its inputs. Thus, only AND gate 109 outputs a logic high signal which is applied to signal line S1, and signal lines S2 and S3 receive logic low signals.

When a logic low signal is applied to pad 100, bleed-high buffer 102 and bleed-low buffer 104 each output a logic low signal. Latches 106 and 108 invert and stabilize the signals. AND gate 109 receives a logic low signal at both of its inputs; AND gate 110 receives a logic high signal at one of its inputs and a logic low signal at the other input; and AND gate 111 receives a logic high signal at both of its inputs. AND gate 111 outputs a logic high signal which is applied to signal line S3, and signal lines S1 and S2 receive logic low signals. Finally, in the case where no signal is applied to pad 100, i.e., pad 100 remains floating, bleed-high buffer 102 outputs a logic high signal and bleed-low buffer 104 outputs a logic low signal. Latches 106 and 108 invert and stabilize the signals. AND gate 109 receives a logic high signal at one of its inputs and a logic low signal at the other input; AND gate 10 receives a logic high signal at both of its inputs; and AND gate 111 receives a logic low signal at one of its inputs and a logic high signal at the other input. Thus, only AND gate 110 outputs a logic high signal which is applied to signal line S2, and signal lines S1 and S3 receive logic low signals.

Thus, as can be seen, a single pad can be used to provide input signals to multiple internal points within the integrated circuit. With variations in the logic circuitry, unlimited configurations are possible.

Figure 3:
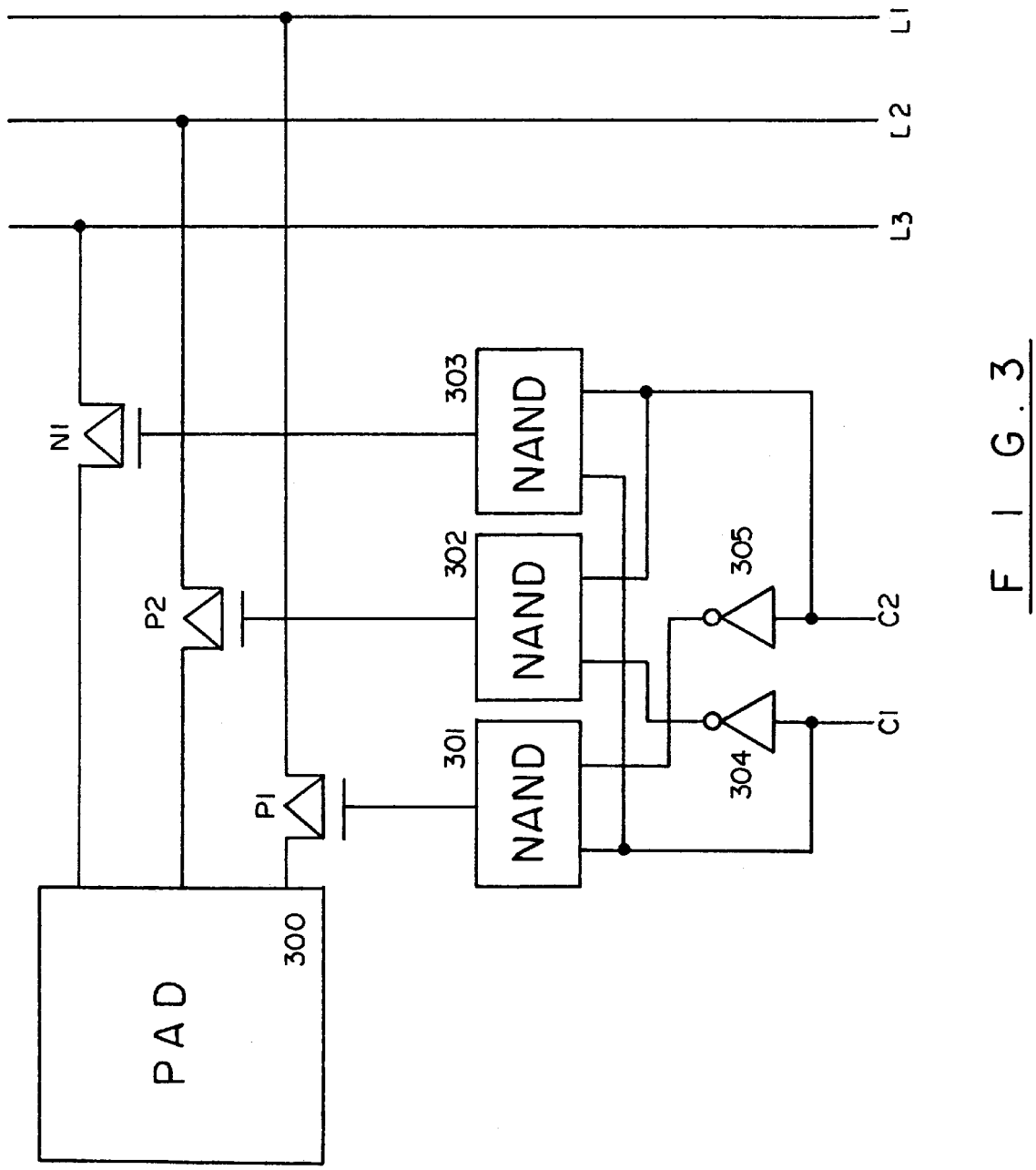
FIG. 3 is a diagram illustrating a second embodiment of the present invention.

FIG. 3 illustrates a second embodiment of a pad system according to the present invention which is designated by reference numeral 350. Shown in FIG. 3 are pad 300, power transistors P1, P2 and N1 connected to pad 300, NAND gates 301–303 each connected to a respective gate of one of the power transistors, inverters 304 and 305 connected to NAND gates 302 and 301, respectively, control lines C1 and C2 connected to NAND gates 301–303 and inverters 304 and 305, and power lines L1–L3 each connected to a respective power transistor P1, P2 or N1. This embodiment of the present invention allows for four separate voltage states of the integrated circuit or device to be supplied or monitored.

The pad system 350 illustrated by FIG. 3 allows for bi-directional current flow. The choice of power transistors P1, P2 and N1 are shown as examples only and can be replaced by various other transistors depending on the voltages required or current direction. For example, if the voltage level is positive, a pMOS gate can be used; or, if the voltage level is zero or negative, an nMOS gate can be used.

One application of this embodiment can be utilized during manufacture of an integrated device, as the integrated device must undergo various programming and testing stages. During different stages, different voltages may need to be supplied to the device, each of which may be different from the actual operating voltage. For example, to program a fuse bank, a first voltage level is required; then, a second voltage level is required to program an anti-fuse bank; and finally, a normal operating voltage is required after the programming is complete. A complete disconnect can also be accomplished by the system 350 shown in FIG. 3.

The inventive pad system 350 not only reduces the number of required pads from three to one, but two of the pads that are required in the prior art remain completely unused after programming is complete, an absolute waste of resources. One skilled in the art can also see that this embodiment of the present invention can be extended to cover more options as long as the control lines are extended accordingly.

Table 2 is a truth table showing the inputs and outputs of the pad system 350 shown in FIG. 3. Listed in the first column are four signal states that can be placed on pad 300. Listed in the second and third columns, respectively, are control line C1 signals and control line C2 signals. Listed in the fourth column are the resulting power line signals. In the current example, P1 and P2 are pMOS gates and N1 is an nMOS gate. In the pad system 350, a high voltage level can be supplied to power lines L1 and L2, while a zero or negative voltage level can be supplied on power line L3.

TABLE 2

| Pad Input | Control Line C1 | Control Line C2 | Output |
| --- | --- | --- | --- |
| VH1 | high | low | L1 |
| VH2 | low | high | L2 |
| GND | low | low | L3 |
| N/A | high | high | floating |

The signals present on control lines C1 and C2, through the use of the logic circuit of the inverters 304 and 305, and NAND gates 301–303, will determine which of the power transistors P1, P2 or N1 are turned on or off. The control signals C1 and C2 can be supplied from an external source through other pads, or can be supplied from another location internal to the integrated device itself.

A description of the operation of the pad system 350 shown in FIG. 3 will now be described. As can be seen from FIG. 3 and Table 2, by applying a high signal to control line C1 and a low signal to control line. C2, power transistor P1 will be turned on, and power transistors P2 and N1 will be turned off. A voltage placed on pad 300 will be supplied via transistor P1 to output power line L1. Power lines L2 and L3 will remain electrically disconnected from pad 300 as transistors P2 and N1 are off.

By applying a low signal to control line C1 and a high signal to control line C2, power transistor P2 will be turned on, and power transistors P1 and N1 will be turned off. A voltage placed on pad 300 will be supplied via transistor P2 to output power line L2. Power lines L1 and L3 will remain electrically disconnected from pad 300 as transistors P1 and N1 are turned off. By applying a low signal to control line C1 and a low signal to control line C2, power transistor N1 will be turned on, and power transistors P1 and P2 will be turned off. A voltage placed on pad 300 will be supplied via transistor N1 to output power line L3. Power lines L1 and L2 will remain electrically disconnected from pad 300 as transistors P1 and P2 are turned off. Finally, by applying a high signal to control line C1 and a high signal to control line C2, power transistors P1, P2 and N1 will all be turned off, and the power lines will be in a floating state, i.e., not electrically connected to pad 300.

As is apparent to one skilled in the art, the logic circuitry can vary based on the requirements of the particular application. With a small redesign of the logic circuitry, more than one power line can be supplied or monitored at one time. Also, as stated earlier, with the addition of more control lines, the circuit can be expanded to supply and monitor any number of power lines in the integrated device. Finally, one skilled in the art could easily combine the first and second pad system embodiments resulting in a device as shown in FIG. 4.

Shown in FIG. 4 are pads 400–402, bus lines B1–B 7, pad logic 1 connected between pad 400 and bus lines B2–B4, pad logic 2 connected between pad 401 and bus lines B5–B7, and test control circuit 403 connected to pad logic 2 via control lines C1 and C2. Pad 402 is directly connected to bus line B1. If bus lines B2–B4 are signal lines, pad 400 and pad logic 1 comprise the first embodiment. And if bus lines B5–B7 are signal lines, pad 401 and pad logic 2 comprise the second embodiment. Pad 402 and bus line B1 are a traditional pad hookup. This results in multiple signal buses being shared by one pad and multiple power buses shared by another pad. The pad logic previously described is utilized to decode or multiplex the pads to the various bus lines B1–B7. A maximum space saving can be accomplished by implementing a pad sharing strategy best suited to a particular application.

In a third embodiment of the present invention, disclosed is a device for improving the testability of systems embedded in the integrated device. It is well known that integrated devices utilize macros having at least one circuit system to achieve multiple functions and operations. For example, an integrated device used in a wireless communication device, e.g., a personal digital assistant (PDA), a global positioning system (GPS), a cell phone, or other handheld system, may comprise an embedded DRAM memory macro, a flash memory macro, or a DSP macro, to name a few. The macros themselves are on-chip programs to test the operability of the separate circuit systems.

Figure 5:
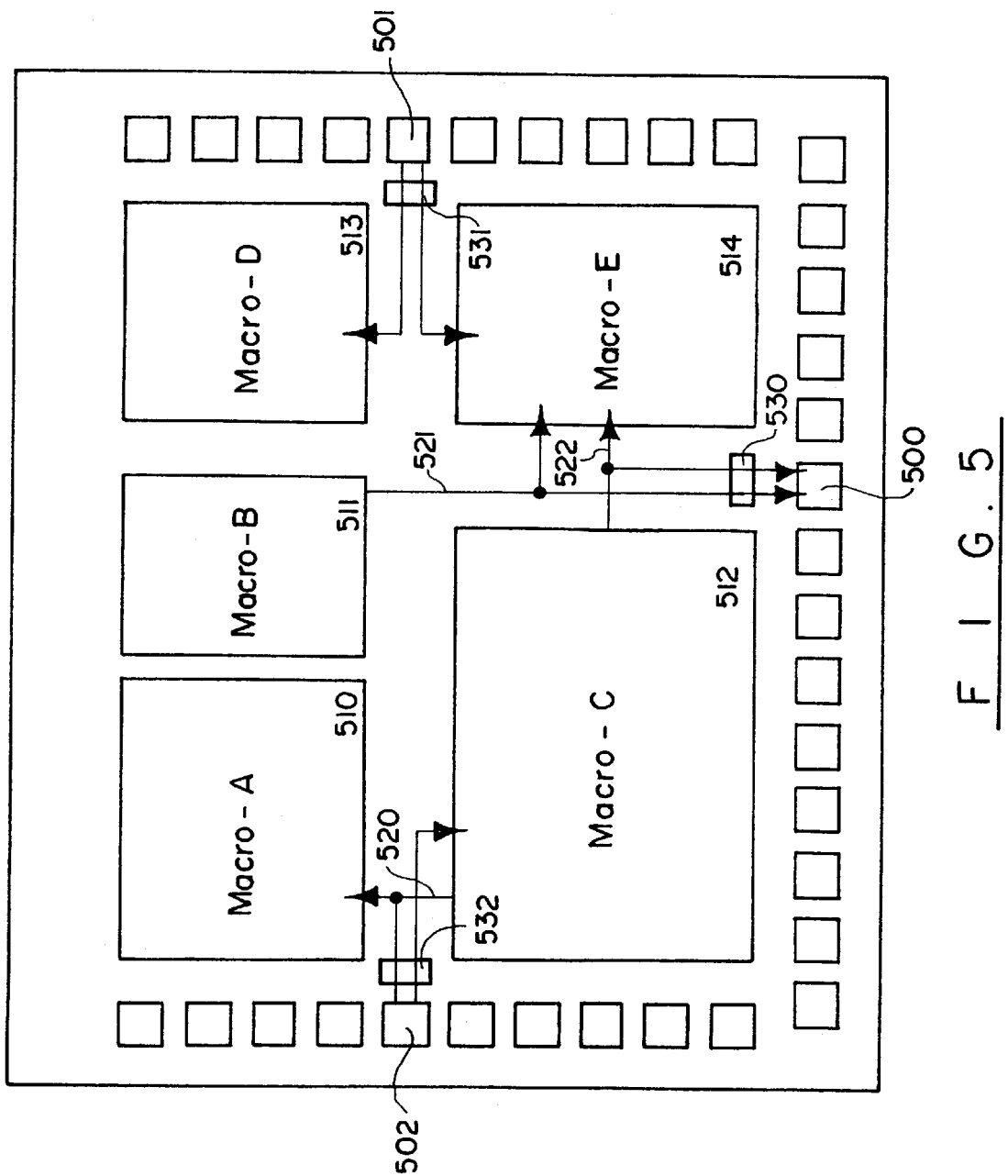
FIG. 5 is a diagram illustrating an integrated circuit incorporating the embodiments of the present invention.

FIG. 5 is a diagram illustrating an integrated circuit incorporating an embodiment of the present invention. Shown in FIG. 5 are multiple pads positioned along the perimeter of the integrated circuit, and five subsystems 510–514. Pads 500–502 are shown connected to selected subsystems. Associated with each pad 500–502 are pad logics 530–532, respectively. Five macros, i.e., Macro A to Macro E, are shown as part of subsystems 510–514, respectively. For ease of description, the subsystems will be referred to by their associated macros. Interconnects 520–522 are provided linking Macros C and A, Macros B and E, and Macros C and E, respectively. Pad 500 is shown connected to interconnects 521 and 522 in a configuration to monitor the signals transferring between the connected macros.

For example, an output pin from Macro B can be monitored via pad 500 by providing the proper control signals to pad logic 530, and after testing Macro B, pad logic 530 can be reconfigured to monitor an output pin from Macro C. Pad 501 can be used to supply Macro D and Macro E with voltage during testing. The voltages supplied to the macros can be the same or different, and with the proper logic circuitry the voltages can be supplied at the same or different times. Control signals can be passed to pad logic 531 to control when the voltages are to be supplied to the macros. Pad 502 can be used to feed signals to both Macro A and C. In this setup, Macro A is shown receiving a signal from Macro C along interconnect 520. In the present embodiment, pad 502 can supply the signal to Macro A independent of Macro C and thus test subsystem 510 independently of subsystem 512. After Macro A is tested, pad logic 532 can switch the connection to Macro C and provide signal input via pad 502.

FIGS. 6A and 6B provide further detail of the bleed low and bleed high buffers shown in FIG. 1 at 104 and 102, respectively. FIG. 6A shows a bleed low buffer including a first pMOS transistor at 611, a first nMOS transistor at 612, an inverter at 613, and a second nMOS transistor at 614. FIG. 6B shows a bleed high buffer including a first pMOS transistor at 601, a first nMOS transistor at 602, an inverter at 603, and a second pMOS transistor at 604. It is, of course, understood by one of ordinary skill in the art that a transistor may include a source, a drain, and a gate.

By utilizing the pad systems disclosed herein and illustrated by FIGS. 1 and 3–5, full advantage can be taken of the limited number of space available on an integrated device. Also, chip size can be reduced by optimizing the pad sharing. Accordingly, several advantages of the present invention include: (1) saving chip area by reducing the number of pads, (2) increasing the testability of the integrated circuits or devices fabricated on a chip, (3) providing access to critical nodes of an embedded system, so that debugging of the system is more efficient. Hence, the pad systems of the present invention provide an effective way to satisfy the testing demands of highly compacted and sophisticated chips. Further, by using less pads allows for the unused area of a chip to be used for increasing the number of transistors or other devices on the integrated circuit, and in turn increasing the number of systems fabricated on a single chip.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A pad system for an integrated circuit or device, said pad system comprising:

logic circuitry having at least one pad input terminal for connecting to at least one pad; and at least two output terminals for connecting to at least one circuit system of said integrated circuit or device;

wherein said logic circuitry comprises:

a first signal path circuitry for outputting a logic high signal when a logic high signal or no signal is applied to the pad input terminal, a second signal path circuitry for outputting a logic low signal when a logic low signal or no signal is applied to the pad input terminal, and an output signal path circuitry for receiving the output signals from the first and second signal path circuitry and outputting at least one of a logic high and a logic low signal;

wherein said logic circuitry is configurable to selectively connect said pad between at least two points of said circuit system, wherein said first signal path circuitry comprises a bleed-high buffer and first inverter circuitry connected to an output of the bleed-high buffer inverter, wherein said second signal path circuitry comprises a bleed-low buffer and second inverter circuitry connected to an output of the bleed-low buffer inverter, wherein the output signal path circuitry comprises: a first, second and third logic AND gate, each having two inputs and an output, one input of the first logic AND gate connected to an output of the bleed-high buffer and the other input of the first logic AND gate connected to an output of the bleed-low buffer, one input of the second logic AND gate connected to an output of the bleed-high buffer and the other input of the second logic AND gate connected to an output of the second inverter circuitry, one input of the third logic AND gate connected to an output of the first inverter circuitry and the other input of the third logic AND gate connected to the output of the second inverter circuitry, and each output of the first, second and third logic AND gates connected to at least one output terminal of the at least two output terminals.

2. A pad system for an integrated circuit or device, said pad system comprising:

logic circuitry having at least one pad input terminal for connecting to at least one pad; and at least two output terminals for connecting to at least one circuit system of said integrated circuit or device;

wherein said logic circuitry comprises:

a first signal path circuitry for outputting a logic high signal when a logic high signal or no signal is applied to the pad input terminal, a second signal path circuitry for outputting a logic low signal when a logic low signal or no signal is applied to the pad input terminal, and an output signal path circuitry for receiving the output signals from the first and second signal path circuitry and outputting at least one of a logic high and a logic low signal, wherein said logic circuitry is configurable to selectively connect said pad between at least two points of said circuit system, wherein said first signal path circuitry comprises a bleed-high buffer and first inverter circuitry connected to an output of the bleed-high buffer inverter, wherein said second signal path circuitry comprises a bleed-low buffer and second inverter circuitry connected to an output of the bleed-low buffer inverter, wherein the first and second inverters circuitries each include two inverters connected in parallel.

3. The pad system of claim 2, wherein the bleed-high buffer comprises:

a first, a second and a third transistor each having a gate, a drain, and a source, the drain of the first transistor and the gate of the second and third transistors connected to an input of the bleed-high buffer, and the source of the second transistor connected to the drain of the third transistor; and a bleed-high buffer inverter having an input and an output, the input connected to the source of the second transistor and the drain of the third transistor.

4. The pad system of claim 2, wherein, the bleed-low buffer comprises:

a first, a second and a third transistor each having a gate, a drain and a source, the source of the first transistor and the gate of the second and third transistors connected to an input of the bleed-low buffer, and the source of the second transistor connected to the drain of the third transistor; and a bleed-low buffer inverter having an input and an output, the input connected to the source of the second transistor and the drain of the third transistor.

5. The pad system of claim 2, wherein the logic circuitry comprises:

at least two transistors having a gate, a source, and a drain, each drain connected to a respective pad input terminal of the at least one pad input terminal, each source connected to a respective output terminal of the at least two output terminals;

at least two NAND gates connected to a respective transistor of the first, second and third transistors; and at least one inverter having an input and an output, each inverter input connected to a respective control signal input terminal, and each inverter output connected to a respective NAND gate of the at least two of NAND gates.

6. The pad system of claim 2, wherein the logic circuitry comprises:

at least three transistors having a gate, a source, and a drain, each drain connected to a respective pad input terminal of the at least one pad input terminal, and each source connected to a respective output terminal of the at least two output terminals;

at least two inverters each having an input and an output; and at least three logic NAND gates each having at least two inputs and an output, each output connected to a gate of a respective transistor of the at least three transistors, an input of a first logic NAND gate connected to a first control signal input terminal and another input of the first logic NAND gate connected to the output of a first inverter of the at least two inverters, an input of a second logic NAND gate connected to a second control signal input terminal and another input of the second logic NAND gate connected to the output of a second inverter of the at least two inverters, and an input of a third logic NAND gate connected to the second control signal input terminal and another input of the first logic NAND gate connected to the output of the first inverter of the at least two inventors.

7. A pad system comprising:

at least one pad each having at least one pad input terminal;

a first logic circuit configured for connecting to one of the at least one pad; and a second logic circuit configured for connecting to another of the at least one pad;

wherein the first and second logic circuits are configured for connecting to respective buses of an integrated circuit or device for electrically connecting to at least one point within the integrated circuit or device, wherein the first logic circuit comprises:
a first signal path circuitry for outputting a logic high signal when a logic high signal or no signal is applied to a pad input terminal of the at least one pad input terminal,
a second signal path circuitry for outputting a logic low signal when a logic low signal or no signal is applied to the pad input terminal, and
an output signal path circuitry for receiving the output signals from the first and second signal path circuitries and outputting at least one of a logic high and a logic low signal, wherein the first signal path circuitry comprises a bleed-high buffer, and the second signal path circuitry comprises a bleed-low buffer, wherein the bleed-high buffer comprises:
a first, a second and a third transistor each having a gate, a drain, and a source, the drain of the first transistor and the gate of the second and third transistors connected to the input of the bleed-high buffer, the gate of the first transistor and the drain of the second transistor connected to a logic high signal, the sources of the first and third transistors connected to a logic low signal, and the source of the second transistor connected to the drain of the third transistor, and a bleed-high buffer inverter having an input and an output, the input connected to the source of the second transistor and the drain of the third transistor, wherein the output signal path circuitry comprises:
a first, second and third logic AND gate, each having two inputs and an output, one input of the first logic AND gate connected to the output of the bleed-high buffer and the other input of the first logic AND gate connected to the output of the bleed-low buffer, one input of the second logic AND gate connected to the output of the bleed-high buffer and the other input of the second logic AND gate connected to the output of the second inverter, one input of the third logic AND gate connected to the output of the first inverter and the other input of the third logic AND gate connected to the output of the second inverter, and each output of the first, second and third logic AND gates connected to at least one output terminal.

8. A pad system comprising:

at least one pad each having at least one pad input terminal;

a first logic circuit configured for connecting to one of the at least one pad; and a second logic circuit configured for connecting to another of the at least one pad;

wherein the first and second logic circuits are configured for connecting to respective buses of an integrated circuit or device for electrically connecting to at least one point within the integrated circuit or device, wherein the first logic circuit comprises:
a first signal path circuitry for outputting a logic high signal when a logic high signal or no signal is applied to a pad input terminal of the at least one pad input terminal,
a second signal path circuitry for outputting a logic low signal when a logic low signal or no signal is applied to the pad input terminal, and
an output signal path circuitry for receiving the output signals from the first and second signal path circuitries and outputting at least one of a logic high and a logic low signal, wherein the first signal path circuitry comprises a bleed-high buffer, and the second signal path circuitry comprises a bleed-low buffer, wherein the first signal path circuitry further comprises a first inverter connected to an output of a bleed-high buffer inverter and the bleed-high buffer, and the second signal path circuitry further comprises a second inverter connected to an output of a bleed-low buffer inverter of the bleed-low buffer, wherein the first and second inverters are connected in parallel with a third and fourth inverter, respectively, the output of the first inverter connected to an input of the third inverter, the input of the first inverter connected to an output of the third inverter, the output of the second inverter connected to an input of the fourth inverter, and the input of the second inverter connected to an output of the fourth inverter.

9. The pad system of claim 8, wherein the bleed-low buffer comprises:

a first, a second and a third transistor each having a gate, a drain and a source, the source of the first transistor and the gate of the second and third transistors connected to the input of the bleed-high buffer, the gate of the first transistor and the source of the third transistor connected to a logic low signal, the drains of the first and second transistors connected to a logic high signal, and the source of the second transistor connected to the drain of the third transistor; and a bleed-low buffer inverter having an input and an output, the input connected to the source of the second transistor and the drain of the third transistor.

10. A pad system comprising:

at least one pad each having at least one pad input terminal;

a first logic circuit configured for connecting to one of the at least one pad;

a second logic circuit configured for connecting to another of the at least one pad, said second logic circuit comprising:

at least one control signal input terminal, at least two transistors having a gate, a source and a drain, each drain connected, to the at least one pad input terminal, each source connected to at least one output terminal, and the gate of one of the at least two transistors connected to a control signal input terminal of the at least one control signal input terminal, and at least one logic circuit inverter having an input and an output, the inverter input connected to the control signal input terminal of the at least one control signal input terminal and the inverter output connected to the gate of one of the at least two transistors not connected to the control signal input terminal of the at least one control signal input terminal; and a control circuit connected to the at least one control signal input terminal for transmitting at least one control signal to the second logic circuit, wherein the first and second logic circuits are configured for connecting to respective buses of an integrated circuit or device for electrically connecting to at least one point within the integrated circuit or device.

11. The pad system of claim 10, wherein one of the at least one control signal is received by the at least one logic circuit inverter and first and second NAND gates of the second logic circuit.

12. A system for connecting a pad to at least two points in an integrated circuit, comprising:

a pad;

a first, second, and third transistor, said first, second, and third transistor each being connected to said pad;

a first, second, and third NAND gate, said first NAND gate being connected to said first transistor, said second NAND gate being connected to said second transistor, said third NAND gate being connected to said third transistor;

a first and second inverter, said first inverter being connected to said second NAND gate, said second inverter being connected to said first NAND gate;

a first and second control line, said first control line being connected to said first and third NAND gates and to said first inverter, said second control line being connected to said second and third NAND gates and to said second inverter; and a first, second, and third power line, each of said power lines being connected to a respective one of said first, second, and third transistors, wherein applying a high signal to said first control line and a low signal to said second control line causes said first transistor to be turned on and said second and third transistors to be turned off, wherein applying a low signal to said first control line and a high signal to said second control line causes said second transistor to be turned on and said first and third transistors to be turned off, wherein applying a low signal to said first and second control lines causes said third transistor to be turned on and said first and second transistors to be turned off, and wherein applying a high signal to said first and second control lines causes said first, second, and third transistors to be turned off.

13. A system as in claim 12, wherein each of said first and second transistors is a pMOS transistor, and wherein said third transistor is an nMOS transistor.

* * * * *